United States Patent
Chen et al.

(10) Patent No.: US 9,529,034 B2
(45) Date of Patent: Dec. 27, 2016

(54) REAL-TIME INSULATION DETECTOR FOR FEEDING HIGH-FREQUENCY LOW-VOLTAGE SIGNAL OF POWER SYSTEM

(71) Applicants: Hsi-Chuan Chen, Keelung (TW); Tien-Jen Chen, Keelung (TW)

(72) Inventors: Hsi-Chuan Chen, Keelung (TW); Tien-Jen Chen, Keelung (TW)

( * ) Notice: Subject to any disclaimer, the term of this patent is extended or adjusted under 35 U.S.C. 154(b) by 237 days.

(21) Appl. No.: 14/526,939

(22) Filed: Oct. 29, 2014

(65) Prior Publication Data
US 2016/0124036 A1 May 5, 2016

(51) Int. Cl.
*G01R 31/02* (2006.01)
*G01R 31/12* (2006.01)

(52) U.S. Cl.
CPC .......... *G01R 31/025* (2013.01); *G01R 31/027* (2013.01); *G01R 31/1272* (2013.01)

(58) Field of Classification Search
CPC .... G01R 31/1272; G01R 31/40; G01R 31/021
See application file for complete search history.

(56) References Cited

U.S. PATENT DOCUMENTS

| 2011/0257924 A1* | 10/2011 | Bryant | H01F 27/402 702/122 |
| 2015/0293167 A1* | 10/2015 | Kawamura | G01R 31/14 324/551 |

\* cited by examiner

*Primary Examiner* — Jaweed A Abbaszadeh
*Assistant Examiner* — Alyaa T Mazyad
(74) *Attorney, Agent, or Firm* — Alan D. Kamrath; Kamrath IP Lawfirm, P.A.

(57) ABSTRACT

A real-time insulation detector for feeding a high-frequency low-voltage signal is electrically connected with a power system, and the power system includes a power circuit comprised of a main power circuit and plural branch circuits, a plurality of power transformers are arranged in the main power circuit and the plural branch circuits, and each current power transformer has a positive electrode point and a negative electrode point arranged on a low-voltage side thereof, the real-time insulation detector contains a central controller, a signal generator, a circuit selector, a plurality of detection circuits, plural first safety circuits, and plural second safety circuits. Thereby, the real-time insulation detector automatically feeds a high-frequency low-voltage detection signal, and when the power system runs in an uninterruptible power network, the central controller judges aging insulation comes from which one cable or component of the power system.

8 Claims, 3 Drawing Sheets

REAL-TIME INSULATION DETECTOR FOR FEEDING HIGH-FREQUENCY LOW-VOLTAGE SIGNAL OF POWER SYSTEM

BACKGROUND OF THE INVENTION

Field of the Invention

The present invention relates to a real-time insulation detector for feeding a high-frequency low-voltage signal of a power system, and more particularly to the real-time insulation detector which automatically feeds a high-frequency low-voltage detection signal, and when the power system runs in an uninterruptible power network, a central controller judges aging insulation comes from which one cable or component of the power system.

Description of the Prior Art

A conventional power system is comprised of at least one circuit breaker, at least one current power transformer, and at least one power transformer which are serially and parallelly connected together. As shown in FIG. 1, a power system A0 contains a main power circuit and three branch circuits, wherein the main power circuit of the power system A0 is parallelly connected with the three branch circuits, and the main power circuit and each branch circuit have a circuit breaker A1, a current power transformer A2, a power transformer A3, and a transmission line impedance A4.

However, insulation material of each component of the power system A0 is aged because of overheating, moisture, dust, oxidation, chemical pollution, and salt damage, thus leaking capacitance value and currents quickly to damage the power system. To avoid such damage, the power system is shut down for detection and check annually, thus causing power failure and high maintenance cost. Although the power system is maintained and checked periodically, power system failure initiates a trouble or an accident suddenly.

Test items of the power system A0 includes testing high resistance meter, AC or DC voltage, and dielectric power factors, and these test items are scheduled after confirming an outage detection, and then the power system is operated. Unfortunately, aging insulation of each component of the power system cannot be prevented as operating the power system.

In addition, insulation test of a partial discharge of a power generator, a UHV transformer, and a circuit breaker is executed at 10 KV/400 Hz before delivering the power generator, the UHV transformer, and the circuit breaker. Alternatively, an Off line is detected and checked periodically in overhaul outage.

Some factories develops On line discharge equipment, but at least one sensing element is fixed on the On line discharge equipment in manufacturing process or overhaul process at high maintenance cost, and unsafe factors cannot be overcome, because the at least one sensing element is placed in high-voltage equipment in a long time, and it will be aged easily to cause accident.

The waveform of the partial discharge is tested by an oscilloscope in a pattern matching manner, yet it is only tested accurately based on data base. Coulomb number and discharge voltage for measuring discharge and ultraviolet light test are developed, but a uniform standard for these tests is not confirmed till now.

The present invention has arisen to mitigate and/or obviate the afore-described disadvantages.

SUMMARY OF THE INVENTION

The primary objective of the present invention is to provide a real-time insulation detector for feeding a high-frequency low-voltage signal of a power system which automatically feeds a high-frequency low-voltage detection signal, and when the power system runs in an uninterruptible power network, a central controller judges aging insulation comes from which one cable or component of the power system, thus merely maintaining the cable or the component which ages insulation.

To obtain above-mentioned objective, a real-time insulation detector for feeding a high-frequency low-voltage signal of a power system provided by the present invention is electrically connected with a power system, and the power system includes a power circuit comprised of a main power circuit and plural branch circuits, a plurality of power transformers are arranged in the main power circuit and the plural branch circuits, and each current power transformer has a positive electrode point and a negative electrode point arranged on a low-voltage side thereof, the real-time insulation detector contains a central controller, a signal generator, a circuit selector, a plurality of detection circuits, plural first safety circuits, and plural second safety circuits.

The central controller is employed to receive a high-frequency leakage signal of the main power circuit and the plural branch circuits of the power system and to analyze the high-frequency leakage signal, and the central controller sends a driving signal.

The signal generator produces a high-frequency low-voltage detection signal.

The circuit selector includes a first end serially coupled with each first safety circuit, one of the plurality of detection circuits, and the signal generator. The circuit selector also includes two second ends joining with the positive electrode point of the low-voltage side of each current power transformer of the main power circuit and each branch circuit via plural guiding wires. The circuit selector further includes at least one controlling wire joining with the central controller and receives a loop sensing selection controlled by the central controller and distributes high-frequency signals from the signal generator in different times, and each current power transformer sends the high-frequency signals to a tested loop of the power system and sends a feedback signal toward the one of the plurality of detection circuits.

Each detection circuit is configured in the power system and is coupled with each current power transformer of the power system via each first safety circuit and the circuit selector, each detection circuit is also coupled with the central controller and the signal generator to send the high-frequency low-voltage detection signal of the signal generator to the tested loop of the main power circuit or the plural branch circuits of the power system via the circuit selector, and each detection circuit senses the feedback signal and sends the feedback signal to the central controller, hence the central controller analyzes the feedback signal.

Each first safety circuit is fixed in the power system and includes a front end serially connected with the circuit selector, each first safety circuit also includes a rear end serially coupled with each detection circuit and the signal generator to stop low-frequency currents of the tested loop of the power system.

Each second safety circuit is arranged in the main power circuit or each branch circuit of the power system, and each second safety circuit is electrically connected with the positive and negative electrodes points of the low-voltage side of each current power transformer to pass a low-frequency signal and to stop a high-frequency signal.

DETAILED DESCRIPTION OF THE PREFERRED EMBODIMENTS

The present invention will be clearer from the following description when viewed together with the accompanying drawings, which show, for purpose of illustrations only, a preferred embodiment in accordance with the present invention.

Figure 1:
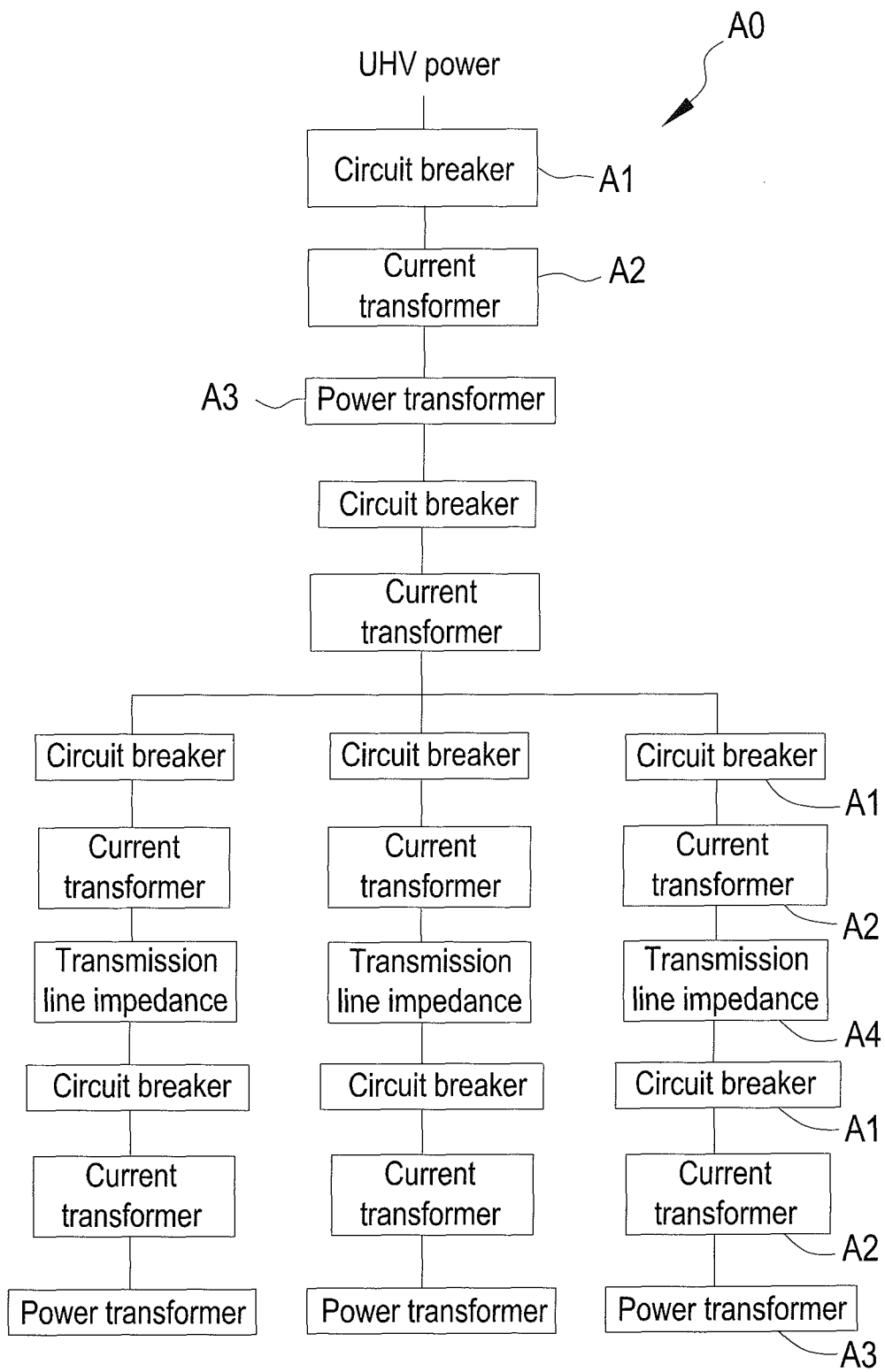
FIG. 1 is a structural diagram of a conventional power system.
Figure 2:
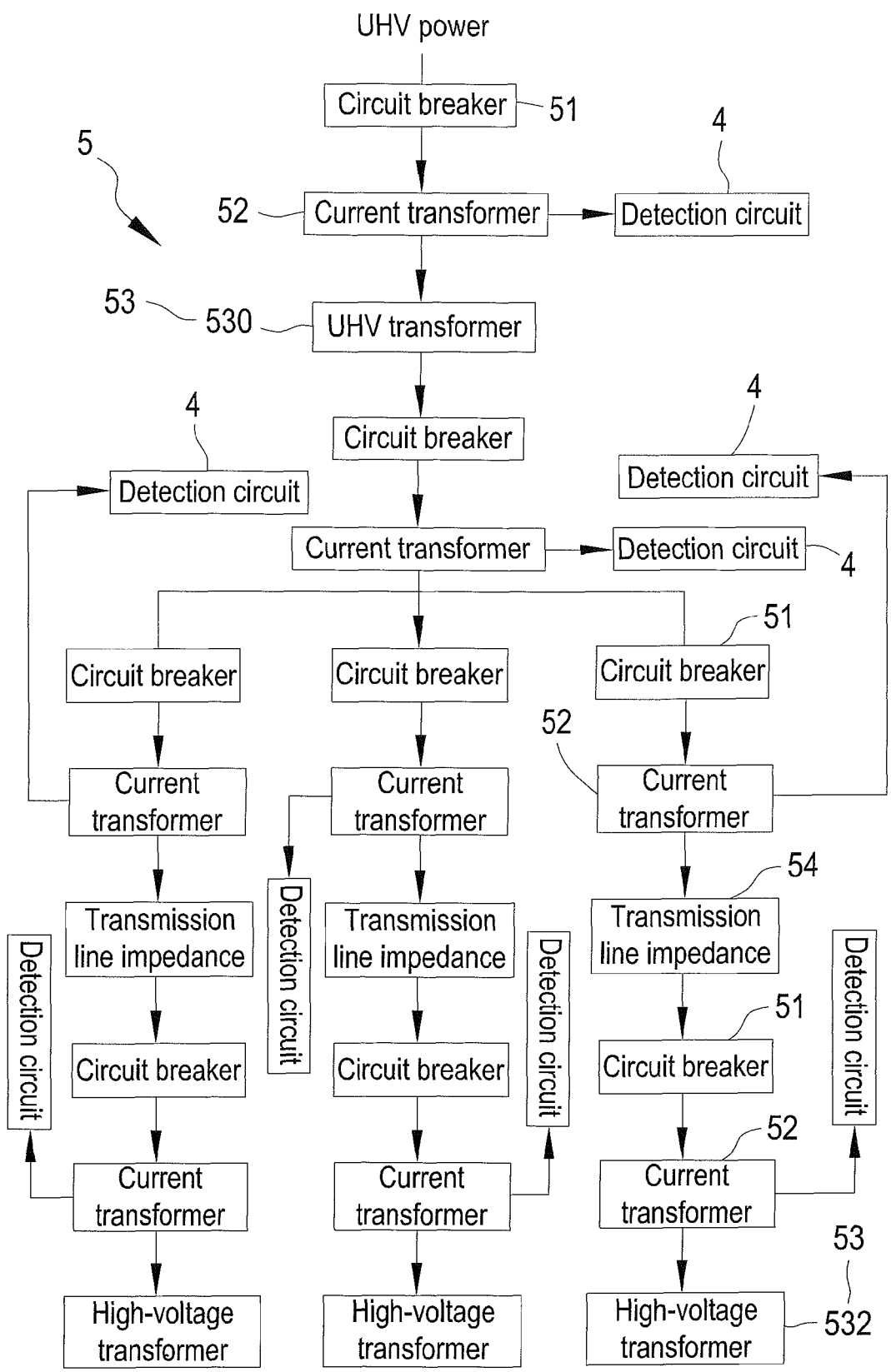
FIG. 2 is a diagram showing the application of a real-time insulation detector for feeding a high-frequency low-voltage signal of a power system according to a preferred embodiment of the present invention.
Figure 3:
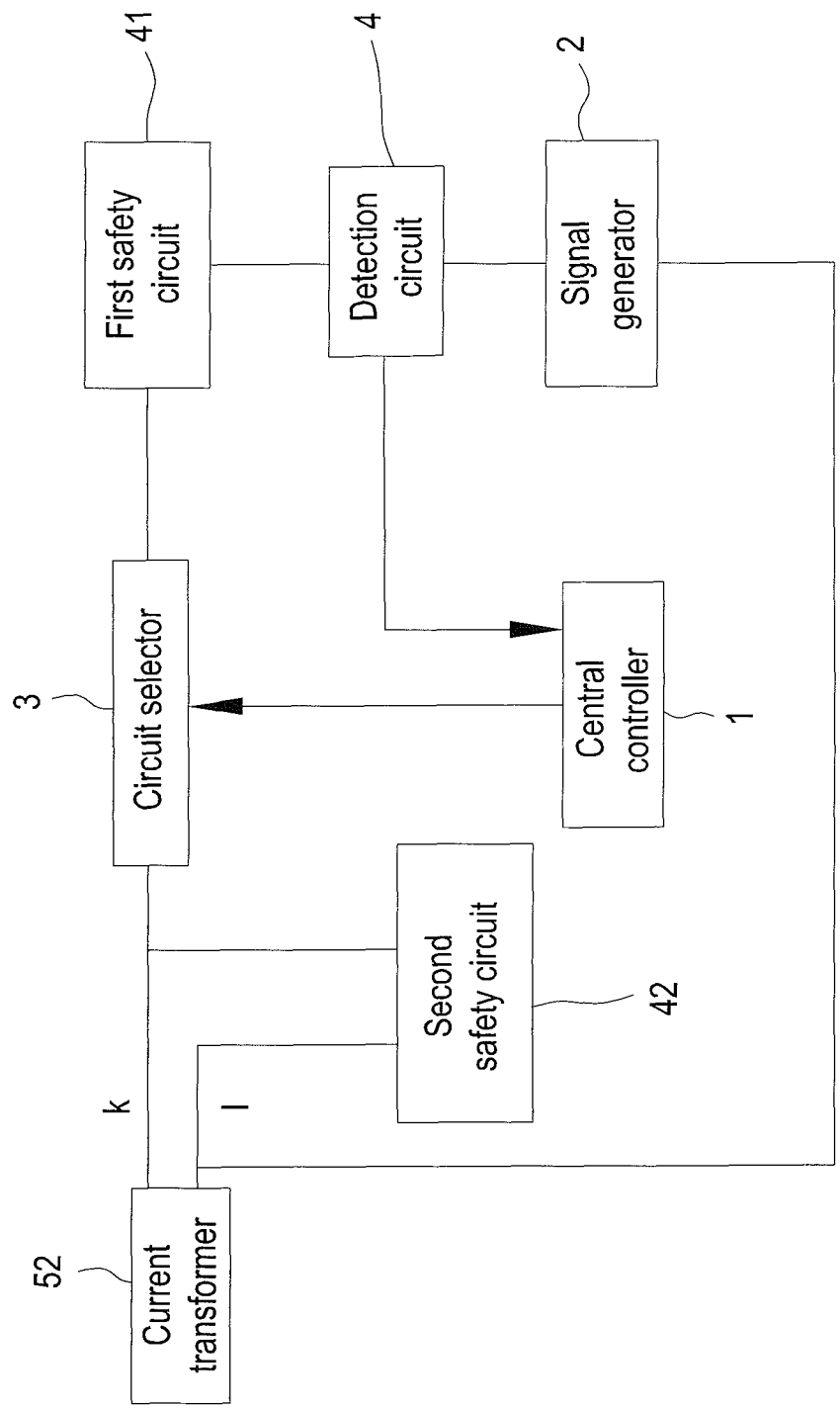
FIG. 3 is a structural diagram showing of the real-time insulation detector for feeding the high-frequency low-voltage signal of the power system according to the preferred embodiment of the present invention.

With reference to FIGS. 2 and 3, a real-time insulation detector for feeding a high-frequency low-voltage signal of a power system according to a preferred embodiment of the present invention is electrically connected with a power system 5, and the power system 5 includes a plurality of circuit breakers (CB) 51, plural current power transformers (CT) 52, a plurality of power transformers (TR) 53, and plural impedances 54 for resisting a power circuit comprised of a main power circuit and plural branch circuits of the power system 5, wherein each power transformer 53 is a UHV transformer 530 or a high-voltage transformer 532. Since the power system 5 is a well-known art, its further remarks are omitted.

The real-time insulation detector comprises a central controller 1, a signal generator 2, a circuit selector 3, and a plurality of detection circuits 4, plural first safety circuits 41, and plural second safety circuits 42.

The central controller 1 is employed to receive a high-frequency leakage signal of the main power circuit and the plural branch circuits of the power system 5 and to analyze the high-frequency leakage signal of the main power circuit and the plural branch circuits of the power system 5. The central controller 1 presets at least one alert value based on parameters of the main power circuit and the plural branch circuits of the power system 5, and when an analyzed value is more than the at least one alert value after analyzing, the central controller 1 is connected with preset control equipment and a monitoring system to send a warming signal toward the preset control equipment and the monitoring system.

The signal generator 2 is configured to produce a high-frequency low-voltage detection signal, wherein the detection signal is ±10V/0~100 MHz.

The circuit selector 3 is arranged in the power system 5 and includes a first end serially coupled with each first safety circuit 41, one of the plurality of detection circuits 4, and the signal generator 2. The circuit selector 3 also includes two second ends joining with a positive electrode point k of a low-voltage side of each current power transformer 52 of the main power circuit and each branch circuit via plural guiding wire. The circuit selector 3 further includes at least one controlling wire joining with the central controller 1 and receives a loop sensing selection controlled by the central controller 1 and distributes high-frequency signals from the signal generator 2 in different times, and each current power transformer 52 sends the high-frequency signals to a tested loop of the power system 5 and sends a feedback signal toward the one of the plurality of detection circuits 4. Preferably, the circuit selector 3 is an electronic switch.

Each detection circuit 4 is configured in the power system 5 and is coupled with each current power transformer 52 of the tested loop of the power system 5 via each first safety circuit 41 and the circuit selector 3. Each detection circuit 4 is also coupled with the central controller 1 and the signal generator 2 and includes a high-frequency current meter and a high-frequency current transmitter, such that each detection circuit 4 sends the high-frequency low-voltage signal of the signal generator 2 to the tested loop of the main power circuit or the plural branch circuits of the power system 5 through the circuit selector 3, and each detection circuit 4 senses the feedback signal and sends the feedback signal to the central controller 1, hence the central controller 1 analyzes the feedback signal.

Each first safety circuit 41 is fixed in the power system 5 and includes a front end serially connected with the circuit selector 3, each first safety circuit 41 also includes a rear end serially coupled with each detection circuit 4 and the signal generator 2 to stop low-frequency currents of the tested loop of the power system 5, thus avoiding damage of the signal generator 2 and passing the high-frequency signals through each first safety circuit 41. Preferably, each first safety circuit 41 is a capacitor or a wave filter and is configured according to actual circuit parameters.

Each second safety circuit 42 is arranged in the main power circuit or each branch circuit of the power system 5, i.e., a number of the plural second safety circuits 42 is determined based on a number of the plural branch circuits. Each second safety circuit 42 is electrically connected with the positive electrode point k and a negative electrode point l of the low-voltage side of each current power transformer 52 to pass a low-frequency signal and to stop a high-frequency signal, thus avoiding a damage of the signal generator 2. Preferably, each second safety circuit 42 is an inductor or a wave filter and is configured according to the actual circuit parameters.

The signal generator 2 sends 2V of high-frequency signals to a high-voltage side of the tested loop of the power system 5 through each current power transformer 52, and because each current power transformer 52 turns ratio dilution, voltage of the high-frequency signals are weak, hence the tested loop of the power system 5 operates well. When the high-frequency signals contact each power transformer 53, other current power transformers 52 or potential power transformers, they are interfered by a high resistance and do not influence operation of downstream systems. Accordingly, the real-time insulation detector senses high-frequency leakage currents of the power system 5, when the power system 5 runs in an uninterruptible power network. Preferably, each current power transformer 52 and the signal generator 2 are not broken by ways of each first safety circuit 41 and each second safety circuit 42.

With an aging of insulation of cables or components of the power system 5, an insulation capacitance changes, and impedance of the insulation capacitance is inversely proportional to frequency ($Xc\Box 1/2\pi fC$), such that the signal generator 2 produces the high-frequency low-voltage detection signal, and the high-frequency low-voltage detection signal is sent to the power system 5 via each current power transformer 52. Due to the impedance of the insulation capacitance of the power system 5 reduces less than thousands of times or ten thousands of times at the high-frequency signals, the high-frequency leakage currents are amplified more than thousands of times or ten thousands of times to be sensed easily. Thereby, the real-time insulation detector continuously senses the high-frequency leakage currents of the power system 5 in the uninterruptible power network to judge if insulation materials are aged.

Furthermore, each detection circuit 4 measures the high-frequency leakage currents of the main power circuit and the plural branch circuits of the power system 5 immediately, and the central controller 1 analyzes a change of the high-frequency leakage currents to judge aging insulation comes from which one cable or component of the power system 5, thus merely maintaining the cable or the component which ages insulation.

The real-time insulation detector automatically feeds the high-frequency low-voltage detection signal, and the feedback signal is sent to the central controller 1 (such as a computer) from the insulation material, when the power system 5 runs in the uninterruptible power network, such that the central controller 1 analyzes the feedback signal without being interfered by any audio videos and stray currents, and the power system 5 senses the high-frequency leakage currents in the uninterruptible power network.

Preferably, the central controller 1 is connected with each detection circuit 4 in a wired manner to receive and analyze the change of the high-frequency leakage currents; or the central controller 1 is connected with each detection circuit 4 in a wireless manner (such as Internet) to receive and analyze the change of the high-frequency leakage current.

In addition, the central controller 1 is electrically connected with the circuit selector 3 to send a driving signal, and the circuit selector 3 is controlled by the central controller 1 to distribute output detecting signal of the one of the plurality of detection circuits 4 in the different times. In other words, the circuit selector 3 receives the driving signal of the central controller 1, and the central controller 1 controls the circuit selector 3 to sense a selection of the main power circuit and the plural branch circuits.

While various embodiments in accordance with the present invention have been shown and described, it is clear to those skilled in the art that further embodiments may be made without departing from the scope of the present invention.

What is claimed is:

1. A real-time insulation detector for feeding a high-frequency low-voltage signal being electrically connected with a power system, and the power system including a power circuit comprised of a main power circuit and plural branch circuits, a plurality of power transformers being arranged in the main power circuit and the plural branch circuits, and each current power transformer having a positive electrode point and a negative electrode point arranged on a low-voltage side thereof, the real-time insulation detector comprising a central controller, a signal generator, a circuit selector, a plurality of detection circuits, plural first safety circuits, and plural second safety circuits; wherein the central controller is employed to receive a high-frequency leakage signal of the main power circuit and the plural branch circuits of the power system and to analyze the high-frequency leakage signal, and the central controller sends a driving signal;

the signal generator produces a high-frequency low-voltage detection signal;

the circuit selector includes a first end serially coupled with each first safety circuit, one of the plurality of detection circuits, and the signal generator; the circuit selector also includes two second ends joining with the positive electrode point of the low-voltage side of each current power transformer of the main power circuit and each branch circuit via plural guiding wires; the circuit selector further includes at least one controlling wire joining with the central controller and receives a loop sensing selection controlled by the central controller and distributes high-frequency signals from the signal generator in different times, and each current power transformer sends the high-frequency signals to a tested loop of the power system and sends a feedback signal toward the one of the plurality of detection circuits;

each detection circuit is configured in the power system and is coupled with each current power transformer of the power system via each first safety circuit and the circuit selector, each detection circuit is also coupled with the central controller and the signal generator to send the high-frequency low-voltage detection signal of the signal generator to the tested loop of the main power circuit or the plural branch circuits of the power system via the circuit selector, and each detection circuit senses the feedback signal and sends the feedback signal to the central controller, hence the central controller analyzes the feedback signal;

each first safety circuit is fixed in the power system and includes a front end serially connected with the circuit selector, each first safety circuit also includes a rear end serially coupled with each detection circuit and the signal generator to stop low-frequency currents of the tested loop of the power system;

each second safety circuit is arranged in the main power circuit or each branch circuit of the power system, and each second safety circuit is electrically connected with the positive and negative electrodes points of the low-voltage side of each current power transformer to pass a low-frequency signal and to stop a high-frequency signal.

2. The real-time insulation detector as claimed in claim 1, wherein each first safety circuit is a capacitor.

3. The real-time insulation detector as claimed in claim 1, wherein each second safety circuit is an inductor.

4. The real-time insulation detector as claimed in claim 1, wherein each first safety circuit and each second safety circuit is a wave filter.

5. The real-time insulation detector as claimed in claim 1, wherein the circuit selector is an electronic switch.

6. The real-time insulation detector as claimed in claim 1, wherein the high-frequency low-voltage detection signal is ±10V/0~100 MHz.

7. The real-time insulation detector as claimed in claim 1, wherein the central controller presets an alert value, and when the high-frequency leakage signal and a high-frequency branch signal are more than the at least one alert value after analyzing, the central controller is connected with preset control equipment and a monitoring system to send a warming signal toward the preset control equipment and the monitoring system.

8. The real-time insulation detector as claimed in claim 1, wherein the central controller is electrically connected with the circuit selector to send the driving signal toward the circuit selector, and the circuit selector is controlled by the central controller to distribute output detecting signal of the one of the plurality of detection circuits in the different times.

* * * * *